United States Patent
Edwards et al.

(10) Patent No.: US 6,725,098 B2
(45) Date of Patent: Apr. 20, 2004

(54) SEMICONDUCTOR RUN-TO-RUN CONTROL SYSTEM WITH MISSING AND OUT-OF-ORDER MEASUREMENT HANDLING

(75) Inventors: Keith A. Edwards, Austin, TX (US); Jianping Zou, Austin, TX (US); James A. Mullins, Round Rock, TX (US)

(73) Assignee: Brooks Automation, Inc., Chelmsford, MA (US)

( * ) Notice: Subject to any disclaimer, the term of this patent is extended or adjusted under 35 U.S.C. 154(b) by 174 days.

(21) Appl. No.: 10/046,359

(22) Filed: Oct. 23, 2001

(65) Prior Publication Data
US 2003/0078680 A1 Apr. 24, 2003

(51) Int. Cl.$^7$ .............................................. G05B 13/02
(52) U.S. Cl. ......................................... 700/31; 700/45
(58) Field of Search ............................. 700/30, 31, 44, 700/45, 47, 48, 52, 121, 28, 29

(56) References Cited

U.S. PATENT DOCUMENTS

| | | | |
|---|---|---|---|
| 5,402,367 A | 3/1995 | Sullivan et al. ............. 364/578 |
| 5,448,684 A * | 9/1995 | Holt ............................ 706/20 |
| 5,661,669 A | 8/1997 | Mozumder et al. ......... 364/552 |
| 5,710,700 A * | 1/1998 | Kurtzberg et al. ............ 700/29 |
| 6,002,839 A * | 12/1999 | Keeler et al. .................. 706/23 |
| 6,148,239 A | 11/2000 | Funk et al. ..................... 700/1 |
| 6,230,069 B1 | 5/2001 | Campbell et al. ........... 700/121 |
| 6,232,134 B1 | 5/2001 | Farber et al. .................. 438/9 |
| 6,248,602 B1 | 6/2001 | Bode et al. ................... 438/14 |
| 6,542,782 B1 * | 4/2003 | Lu .............................. 700/29 |
| 6,594,620 B1 * | 7/2003 | Qin et al. ................... 702/185 |

* cited by examiner

Primary Examiner—Leo Picard
Assistant Examiner—Ryan A. Jarrett
(74) Attorney, Agent, or Firm—Perman & Green, LLP; Richard Pickreign

(57) ABSTRACT

A method for a run-to-run (R2R) control system includes processing materials using a process input and producing a process output, storing the process input in a database, the storing including using a timestamp, storing at least one measurement of the process output in the database aligned with each process input using the timestamp, iterating over the data from the database to estimate a process state, and, if one or more of the measurements is missing from the database, predicting the missing measurements for the database based on a model, and determining an error for calculating a next process input, the error based on the data in the database.

29 Claims, 4 Drawing Sheets

SEMICONDUCTOR RUN-TO-RUN CONTROL SYSTEM WITH MISSING AND OUT-OF-ORDER MEASUREMENT HANDLING

BACKGROUND OF THE INVENTION

1. Field of the Invention

The present invention relates to the field of semiconductor processing and, more particularly, to run-to-run control in semiconductor processing.

2. Description of the Related Art

Today there are many new and innovative manufacturing processes. In semiconductor manufacturing processes, innovative processes are hindered due to a large number of important steps in producing a semiconductor device. Each step in these processes is generally important to the final product. Moreover, the various processes, from the initial growth of the semiconductor material, the slicing of the semiconductor crystal into individual wafers, the fabrication stages (etching, doping, ion implanting, or the like), to the packaging and final testing of the completed device, are so different from one another and specialized that the processes may be performed in different manufacturing locations that contain different control schemes.

Some of the important processes include chemical-mechanical-planarization (CMP), lithography, including overlay and critical dimension (CD) and plasma etching. Overlay and critical dimension are two of several important steps in the lithography stage of semiconductor manufacturing. Overlay control involves measuring the misalignment between two successive patterned layers on the surface of a semiconductor device. Measurements needed for overlay control, such as the x-offset, y-offset, magnification, skew and rotation can be determined initially from a calibration run. However, measurement of the errors in these variables are not measured until after the development of a resist. The resist development is a separate process that takes place long after the lithographic exposure. Overlay control is not the only process for which measurements important to the process are completed well after the process run. Furthermore, other processes outside the semiconductor processing industry also require measurements after a completion of the run of a process.

Due to the separation in the measurements of vital and relevant product characteristics versus the actual process that affects the measurements, measurements are often taken at a different time from when the materials are processed. Thus, the measurements are asynchronous from the process. As a result, there is an accumulation of varying numbers of measurements, on a plurality of different products, that are out of sequence from the order in which the products were processed. Furthermore, some measurements in the sequence are not available at the time a process tool requires a new process setting for a new lot because an operator measured material out of order. In other circumstances, an operator may not have completed a full group of lots queued for measurement at the time a request for a new process setting occurs.

Prior art approaches to the dilemma of later acquired measurements include ignoring missing measurements and imposing operating restrictions on processing such as delaying further processing until measurements are available. Neither approach is satisfactory. Ignoring missing measurements degrades control performance by making what may be vital information unavailable to a controller. Delaying processing reduces manufacturing throughput due to the idle time of waiting for measurements.

What is needed is a more efficient and accurate manufacturing system and method that can account for later acquired measurements for process settings.

SUMMARY OF THE INVENTION

In accordance with the present invention, a run-to-run (R2R) control system provides efficient and accurate process controls that apply a same process for a first run of the control system and one or more subsequent runs. More particularly, the method for controlling a manufacturing process includes: processing materials using a process input and producing a process output; storing the process input in a database, the storing including using a timestamp; storing at least one measurement of the process Output in the database aligned with each process input using the timestamp; iterating over the data from the database to estimate a process state; and, if one or more of the measurements is missing from the database, predicting the missing measurements for the database based on a model, and determining an error for calculating a next process input, the error based on the data in the database.

According to one embodiment, the method includes one or more modules coupled to the database, the one or more modules including at least a sorting module configured to sort measurements received asynchronously from the process according to the timestamp, the sorted measurements including later arriving measurements to allow the next process input to be based at least in part on an error calculated using later available measurements.

Another embodiment is directed to a control system, including: at least a controller for providing a process input; a process tool coupled to the controller to receive the process input and provide a process output; a database coupled to receive the process input and a measure of the process output, the database aligning each process input and each process output according to a timestamp process; a model coupled to receive a database output and provide a model output; and a state estimator coupled to receive the database output and the model output, the state estimator coupled to the controller to provide estimated process inputs based on estimated measurements of the process output corresponding with the aligned process input and process output.

According to another embodiment, the database output includes measurements performed asynchronously from the process, and missing measurements are inserted in an order based on the timestamp process. Further, the database stores the measure of the process output and the estimated measurements of the process output according to a receding horizon filter and the timestamp.

BRIEF DESCRIPTION OF THE DRAWINGS

The present invention may be better understood, and its numerous objects, features and advantages made apparent to those skilled in the art by referencing the accompanying drawings. The use of the same reference number throughout the several figures designates a like or similar element.

DETAILED DESCRIPTION

The embodiments of the present invention as described below provides features that may be altered or developed according to a specific development goals, business concerns and system requirements that may vary from one implementation to another. It will be appreciated that any such alterations of the features of the present invention would be a routine undertaking for those of ordinary skill in the art having the benefit of this disclosure.

The present invention provides a method and system for efficiently and accurately processing materials, for which processing measurements are collected asynchronously from material processing, such as in semiconductor processing.

Figure 1:
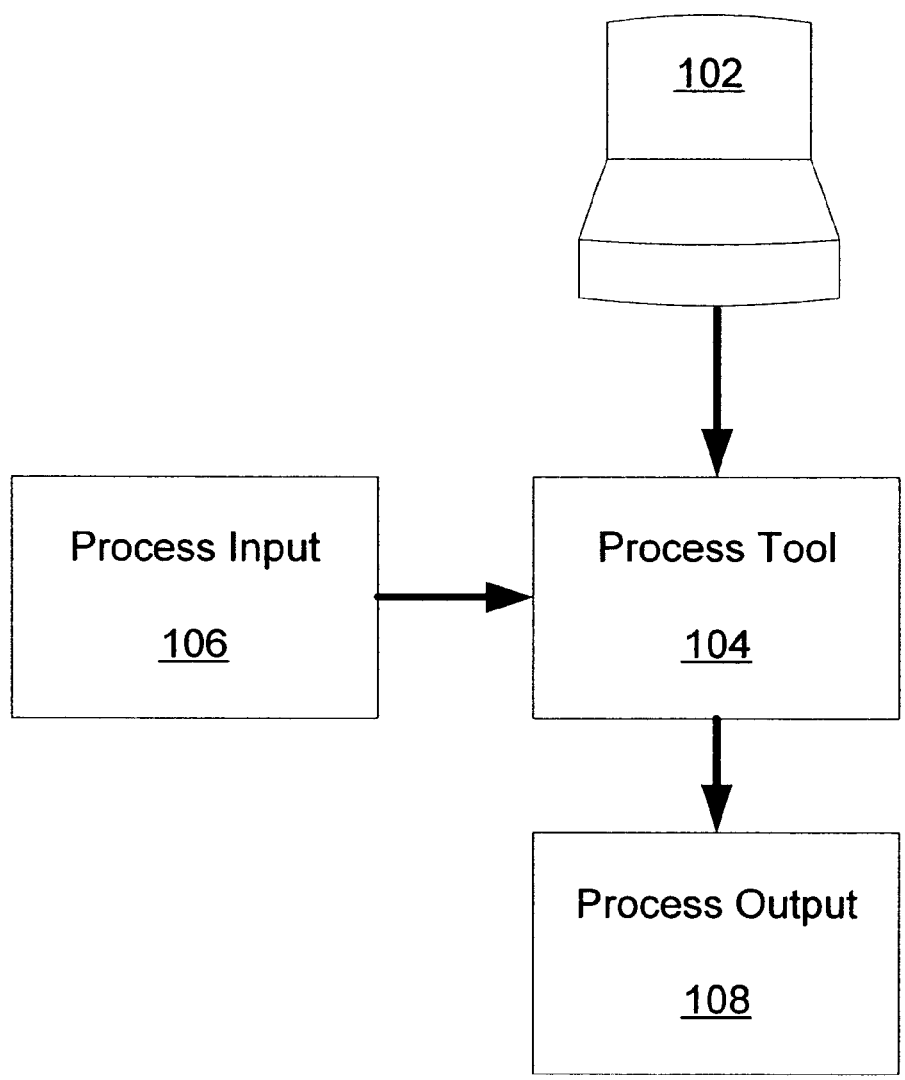
FIG. 1, labeled "prior art", illustrates an exemplary processing system of semiconductor wafers by a semiconductor tool.

Referring to FIG. 1, an embodiment of a prior art control system shows a process input 106, which may be raw materials, partially processed materials, or other process inputs, such as semiconductor materials, that are processed on a process tool 104. Controller 102 is coupled to process tool 104 to provide one or more control input signals. Process tool 104 processes the materials of process input 106 and outputs process output 108.

Figure 2:
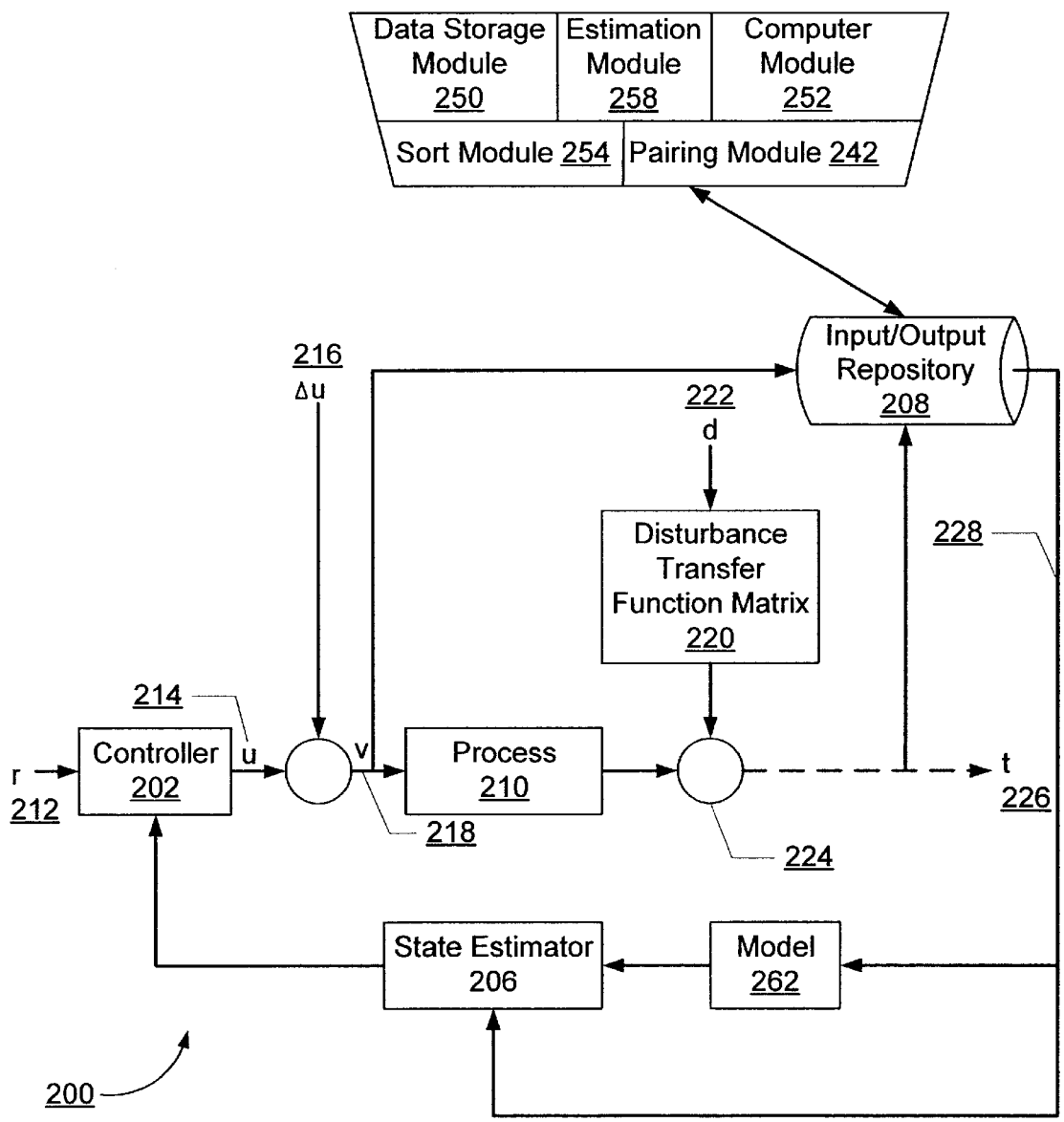
FIG. 2 is a block diagram of a control system in accordance with an embodiment of the present invention.

Referring now to FIG. 2, an R2R control system in accordance with the present invention is shown. Control system 200 includes a process 210 for processing materials coupled to a controller 202. Controller 202 receives a process setpoint r 212 and outputs computed process inputs u 214. Process 210 receives an actual process input v 218 which includes the computed process input 214, as altered by an operator-induced input disturbance Δu 216. Actual process input v 218 is further received by an input/output repository 208, which may be implemented as a database.

Process 210, like process tool 104, processes materials and outputs processed products requiring measurements. Process 210 delivers the products and the parameters of the products. The output of the process tool 210 is measured. The measurements are shown as block 224 and include: (i) measurements that are done in situ; (ii) measurements done shortly after processing; and (iii) later accomplished measurements. Control system 200 operates on the measurements to add a disturbance d 222 via a transfer function, such as disturbance transfer function matrix 220. The process measurements are shown as process output t 226 and are further provided to input/output repository 208. Importantly, measurements t 226 are generally collected asynchronously from actual material processing in process tool 210. Thus, the input measurement of such to process tool 210 may be shown as a dashed line.

Input/output repository 208 provides data 228 to both a model 262 and to a state estimator 206. Input/output repository 208 can be implemented as a database that accumulates past inputs and measurements. Input/output repository 208 further includes a sorter for sorting the inputs and measurements according to a process timestamp and a receding horizon filter or an appropriate substitute filter that handles missing measurements. State estimator 206 receives data from model 202 as well and provides data to controller 202. Controller 202, unlike controller 102, computes process inputs from knowledge of states. The states may be estimated or measured. In one embodiment, the controller 202 includes one or more inverters, model-predictive controllers and simple integral controllers.

In operation, between process runs, none, one, or a plurality of measurements on a product from past process runs may be performed by measurement tool 224. Coupled to input/output repository 208 are several modules 250–258.

The modules include data storage module 250 that captures and stores actual process vectors and measured process output vectors from the input/output repository 208. Pairing module 252 pairs the process input and output vectors according to a process timestamp or a plurality of predicted process timestamps. Sorting module 254 sorts the input/output vector pairs according to the process timestamp(s). Compute module 256 computes a predicted process output or a plurality of process outputs using the process model, and estimation module 258 estimates a process state vector from process inputs, output predictions and actual output vectors.

More particularly, data storage module 250 includes routines to capture the actual process input v 218, attach a timestamp signifying the start of the process 210, store the input v 218 into a sorted list of process input/output pairs for maintenance in input/output repository 208, capture the product measurements t 226 and affiliate them with the corresponding process input v 218 in the stored list within the input/output repository 208.

Input/output repository 208 may be implemented as a database for storing the coordinated input/output pairs for each unit of product. In a semiconductor processing environment, the unit of product may be implemented as a lot of wafers or individual wafers, depending on the granularity of control of a particular site and configuration parameters for the state estimator. Furthermore, the configuration parameters may include the horizon length, the expiration date for measurements and weight matrices. The expiration date of the measurements is a timestamp prior to which the system 200 ignores all process inputs and product measurements. Further configuration parameters are described below.

According to one embodiment, model 262 includes a data structure that contains the linear state model for each of the input/output pairs in the list maintained in input/output repository 208. In a further embodiment, a different model may apply for each input/output pair in circumstances for which each input/output pair may be applicable to a different product with different material properties. Thus, control system 200 handles differing products by advantageously using a standard time-varying linear model, unlike prior art systems.

Characterization of the response for a particular product, j, may be represented by Equation 1:

$$x_{k+1} = A^j x_k + B^j u_k + w_k$$

$$y^j{}_k = C^j x_k + v_k$$

The model form of Equation 1 advantageously requires the storage of only the matrices, $A^j$, $B^j$, and $C^j$. Furthermore, compute module 256 computes a predicted process output or a plurality of predicted process outputs using the process model. More particularly, compute module 256 computes a predicted output, (y), for product j, given an input vector, (u), and process state (x). The iteration index, (k), in Equation 1 refers to the production unit, either a lot or a wafer in a semiconductor environment. However, as may be appreciated by those of skill in the art, the present invention is applicable to production units in other manufacturing contexts. The vectors w and v are state and output error vectors, respectively. Taken collectively for several products, the model of Equation 1 represents a time-varying linear model, since the production order and product types for successive production units are known, i.e., j is known at each instant k, and the model is substantially a function of k.

Referring to controller 202, discussed above, implementations of this controller may include several types of controller modules, including model-predictive control (MPC), direct model inverters and simple integral controllers. In combination with the state estimator 206, controller 202 accesses the current value of the state estimate to compute a process input upon request from, for example, fabrication automation software.

Referring to state estimator 206, in another embodiment, the estimator is a receding-horizon filter that computes state and output error estimates using a constrained, least-squares approach. The least-squares optimization requires the solution to a quadratic program (QP). Equation 2, below provides one basic formulation of the least squares approach for the estimator.

$$\min_{\{w_i, v_i\}} J = w'_{-1} Q w_{-1} + \sum_{i=0}^{N-1} w'_i Q w_i + v'_i S v_i \quad \text{Equation 2}$$

Subject to: Model
$$w_{min} \leq w_i \leq w_{max}$$
$$v_{min} \leq v_i \leq v_{max}$$
$$f_{min} \leq F x_i \leq f_{max}$$

According to a further embodiment, state estimator 206 overcomes many problems common to R2R control applications by advantageously using substantially all data available at the time of a process request. More particularly, according to one embodiment, a model's predicted output in the input/output sequence is substituted when measurements have not been received at the time the process requests an input, and the estimator makes the full use of all the information available to it, including the process model, without requiring the onerous restriction that processing wait until measurements are complete.

Referring to Equation 2 in combination with state estimator 206, in another embodiment, state estimator 206 stores past values in addition to the number in the estimate horizon, N. The state estimator 206 stores: (i) all data up to and including the unit of product, or, in a semiconductor processing environment, the lot (or single wafer) processed immediately prior to the lot (or single wafer); and (ii) with the oldest missing information plus N additional prior inputs and measurements. According to one embodiment, when process 210 requests a new process input for a unit of product, such as a lot (or single wafer), state estimator 206 iterates over the sorted list of input/output pairs stored in the input/output repository 208 in groups of N data points, dropping the oldest and adding the next point into the horizon of N points with each iteration. If a data point with a missing value appears in any group of the N points, state estimator 206 substitutes a prediction from model 262 for that point. The prediction does not assume that the error for that point is zero. Rather, state estimator 206, in one embodiment, estimates an error for that point during its solution of the quadratic program.

When a measurement value for a previously missing value becomes available, the data storage module 250 module substitutes the new measurement in the sorted list held in the input/output repository 208. Upon the next request for a process input, state estimator 206 uses the actual measurement instead of the prediction determined by model 202 for that point, and iterates over all the points from N points prior to the updated measurement to the current point, correcting prior estimates based upon use of the predictions of model 202.

Figure 3:
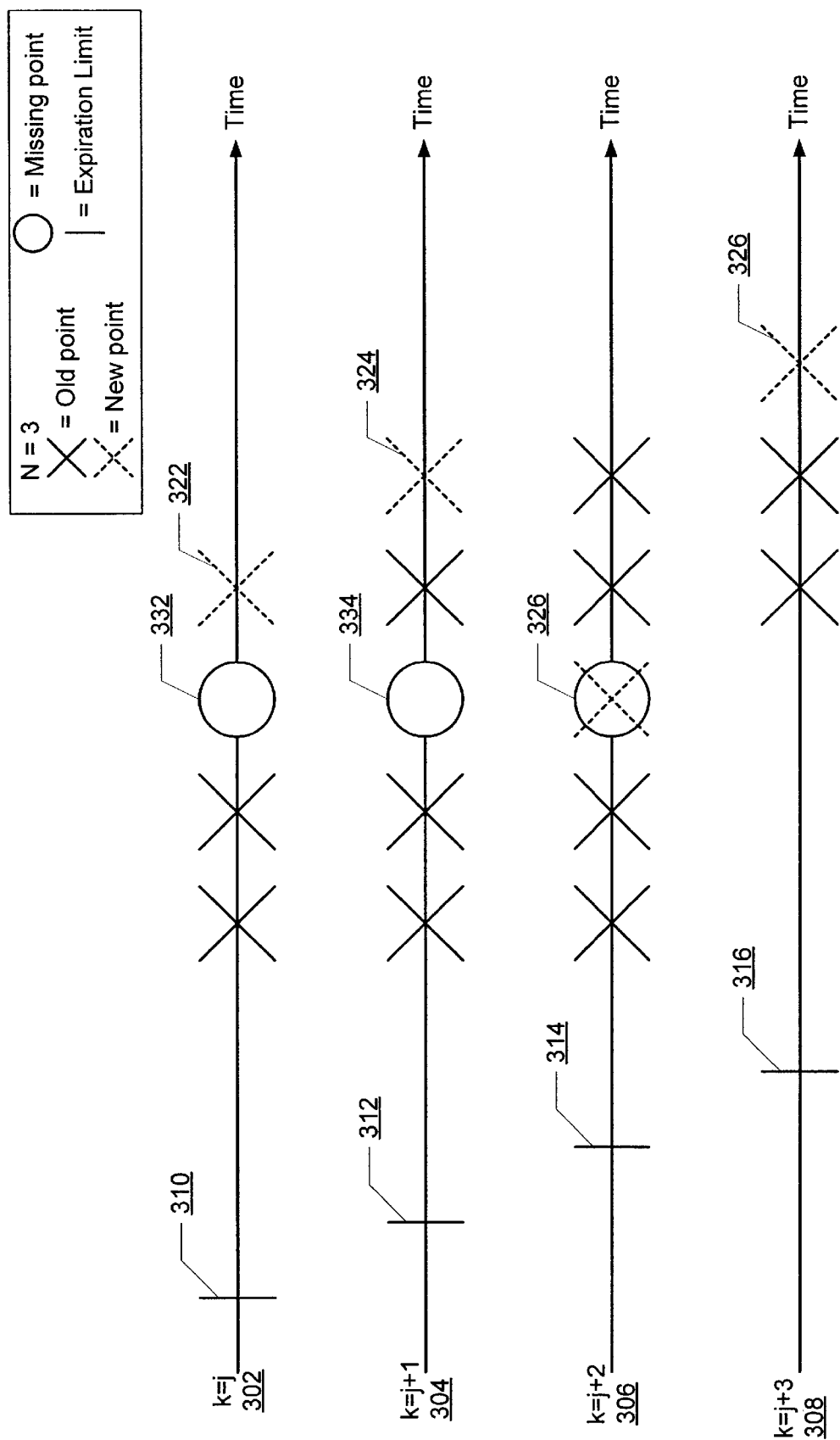
FIG. 3 is a timing diagram illustrating operation of a state estimator in accordance with an embodiment of the present invention.

Referring now to FIG. 3, a sequence progression of estimation intervals of a missing values state estimator is shown. In FIG. 3, the horizon used for configuring state estimator 206 includes a horizon, (N), of 3. However, one of ordinary skill in the art will appreciate, the N chosen is subject to system requirements and other considerations. FIG. 3 illustrates four iterations 302, 304, 306 and 308, with each identified against a time index. Furthermore, each iteration illustrates an expiration limit 310, 312, 314 and 316. At each filter iteration (k), 302, 304, 306 and 308, a measurement for an arbitrary lot or wafer, (j), is received. Data storage module 250 inserts a new measurement in the list maintained within the input/output repository 208 at the appropriate position. The appropriate position is determined in accordance with the receding horizon filter based upon the relevant process timestamp. FIG. 3 illustrates the new points as points 322, 324, 326 and 328. State estimator 206 retrieves the sorted list of input/output data from the input/output repository 208 and iterates over successive groups of N data points to arrive at a current estimate of the process state. In the example shown in FIG. 3, one of the values in the list is missing, as shown in iteration 302 by point 332. In accordance with one embodiment of the invention, state estimator 206 applies the model 262 prediction for that point. Similarly, for iteration j+1, identified as reference numeral 304, the model 262 prediction is applied for point 334, except that the input repository 208 must continue to retain more than N−1 data points due to the missing value in the middle of the known data. At iteration j+2, identified as reference numeral 306, the previously missing data is obtained. Data storage module 250 inserts the data 326 into the input/output repository 208 in the placeholder location for the missing data. State estimator 206 then iterates over the entire list again, this time using the actual data, not the model 202 prediction for the previously missing data point. After completion of this iteration, input/output repository 208 trims the data list to only the N−1 data points needed in anticipation of the $N^{th}$ value at the next iteration. At iteration j+3, identified as reference numeral 308, the system 200 operates as it did for iteration j, because there are no missing data points in the list.

Figure 4:
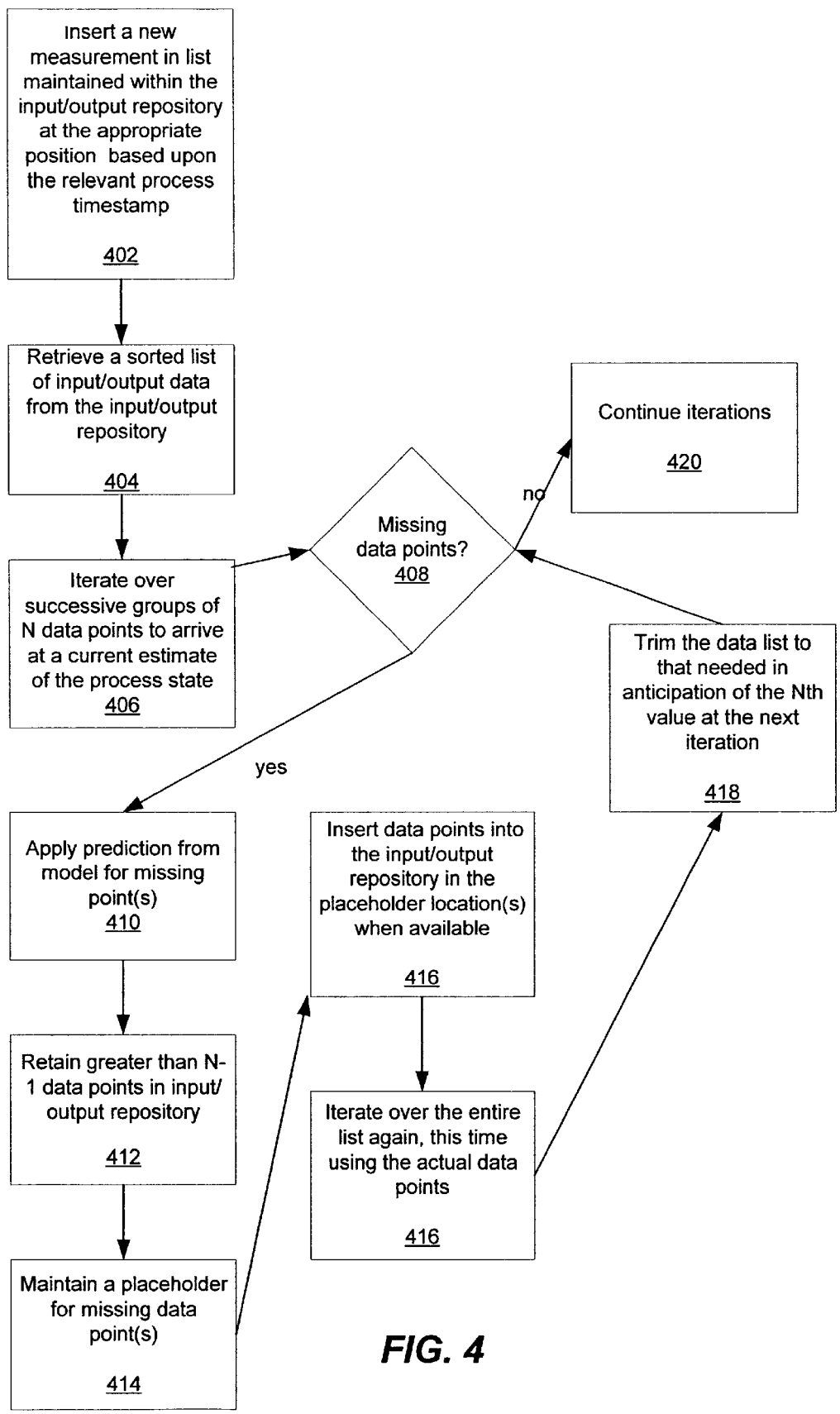
FIG. 4 illustrates is a flow diagram of a method to provide input parameters of a process in accordance with an embodiment of the present invention

Referring to FIG. 4, a flow diagram illustrates the method described above. Block 402 provides for inserting, from the data storage module 250, a new measurement in the list maintained within the input/output repository 208 at the appropriate position determined in accordance with the receding horizon filter and based upon the relevant process timestamp. Block 404 provides for retrieving by the state estimator 206 a sorted list of input/output data from the input/output repository 208. Block 406 provides for iterating over successive groups of N data points to arrive at a current estimate of the process state. Block 408 then provides for determining whether there are missing data points in the list. If there are missing data points, block 410 provides for applying a model 262 prediction for any missing point. Block 412 provides for continuing to retain greater than N−1 data points in input/output repository 208. Upon the determination of missing data points between known data points, block 414 provides for maintaining a placeholder for missing data points. If data points arrive for any missing data points a, block 416 provides for inserting data points into the input/output repository 208 in the placeholder location(s). Block 416 provides for iterating over the entire list again, this time using the actual data points. Block 418 provides for trimming the data list to, for example, N−1 data points needed in anticipation of the $N^{th}$ value at the next iteration.

Referring to controller 202 in FIG. 2 in combination with FIG. 3 and FIG. 4, the model 262 and the state estimator 206 ensure that controller 202 always has access to the most current estimate of the process state using the best available data. Importantly, the prior art regarding controllers needing to deal with missing data generally ignore the missing value and proceed with estimation as if it were not there. In these prior art controllers, the arrival of a prior missing value is either discarded because newer information has already been used to update the state or it is used to update the state, again, with the older information, causing control system performance degradation. Other prior art implementations impose a mandatory operating rule on the fabrication process such that no new lot processing may occur until the control system receives and processes a missing measurement or measurements. This policy imposes huge production capacity limitations on the facilities.

Other Embodiments

Those skilled in the art will appreciate that embodiments disclosed herein may be implemented as software program instructions capable of being distributed as one or more program products, in a variety of forms including computer program products, and that the present invention applies equally regardless of the particular type of program storage media or signal bearing media used to actually carry out the distribution. Examples of program storage media and signal bearing media include recordable type media such as floppy disks, CD-ROM, and magnetic tape transmission type media such as digital and analog communications links, as well as other media storage and distribution systems.

Additionally, the foregoing detailed description has set forth various embodiments of the present invention via the use of block diagrams, flowcharts, and/or examples. It will be understood by those skilled within the art that each block diagram component, flowchart step, and operations and/or components illustrated by the use of examples can be implemented, individually and/or collectively, by a wide range of hardware, software, firmware, or any combination thereof. The present invention may be implemented as those skilled in the art will recognize, in whole or in part, in standard Integrated Circuits, Application Specific Integrated Circuits (ASICs), as a computer program running on a general-purpose machine having appropriate hardware, such as one or more computers, as firmware, or as virtually any combination thereof and that designing the circuitry and/or writing the code for the software or firmware would be well within the skill of one of ordinary skill in the art, in view of this disclosure.

Although particular embodiments of the present invention have been shown and described, it will be obvious to those skilled in the art that, based upon the teachings herein, changes and modifications may be made without departing from this invention and its broader aspects and, therefore, the appended claims are to encompass within their scope all such changes and modifications as are within the true spirit and scope of this invention.

What is claimed is:

1. A method for controlling a manufacturing process, includes:

processing using a process input and producing a process output;

storing the process input in a database;

storing at least one measurement of the process output in the database associated with each process input;

iterating over data from the database to estimate a process state;

if one or more measurements is missing from the database, replacing the missing measurements for the database based on a prediction from a model; and updating said model with said process state estimate.

2. A method for controlling a manufacturing process, includes:

processing using a process input and producing a process output;

storing the process input in a database;

storing at least one measurement of the process output in the database associated with each process input;

iterating over data from the database to estimate a process state;

if one or more measurements is missing from the database, replacing the missing measurements for the database based on a prediction from a model; and updating said model with said processing state estimate, wherein if actual measurements become available a time period after process state estimation, for said one or more measurements which was missing, replacing the predicted measurements with said actual measurements, storing said actual measurements in said database, and utilizing said actual measurements in subsequent process state estimation.

3. The method of claim 1 wherein a controller receives the updated model and utilizes said updated model to produce the next process input.

4. The method of claim 3 wherein the controller comprises one or more of a model-predictive control (MPC) type controller, a direct model inverter type controller, and a simple integral controller.

5. The method of claim 3 wherein the controller minimizes the error in each run of the process using the estimate of the process state.

6. The method of claim 1 wherein the process operates on either a lot or a part of a lot of semiconductor devices.

7. The method of claim 1 wherein the database is coupled to one or more modules that operate on the database.

8. The method of claim 7 wherein the modules include an estimation module, a compute module, a sort module, a pairing module and a data storage module.

9. The method of claim 1 wherein the manufacturing process is a run-to-run (R2R) process for one or more of the following processes: a chemical-mechanical-planarization (CMP) process, a lithography process and a plasma etching process.

10. The method of claim 2 wherein said time period can be variable.

11. The method of claim 1 wherein said storing of the process input includes providing a timestamp, and wherein said at least one measurement of the process output is associated with each process input using the timestamp.

12. A control system includes:

a controller capable of providing a process input;

a process coupled to the controller to receive the process input and provide a process output;

a database configured to receive the process input and a measurement of the process output, the database capable of associating each process input and each process output;

a model capable of providing a model output; and a state estimator coupled to receive the database output and the model output, the state estimator coupled to the controller and capable of generating process state estimates, and configured to provide an updated model to said controller based on said process state estimates.

13. The control system of claim 12 wherein the process operates on a lot or a part of a lot of semiconductor devices.

14. The control system of claim 12 wherein the controller includes one or more of the following model-predictive control (MPC) type controller, a direct model inverter type controller, and a simple integral controller.

15. An apparatus includes:
   means for processing using a process input and producing a process output;
   means for storing the process input in a database, the means for storing including providing a timestamp;
   means for storing at least one measurement of the process output in the database aligned with each process input using the timestamp;
   means for iterating over the data from the database to estimate a process state;
   means for replacing measurements missing from the database based on a prediction from a model; and
   means for updating said model with said process state estimate.

16. A method for controlling a manufacturing process, includes:
   processing using a process input and producing a process output;
   storing the process input in a database;
   storing at least one measurement of the process output in the database associated with each process input;
   iterating over data from the database to estimate a process state, wherein a constrained quadratic optimization is solved at each iteration of data;
   if one or more measurements is missing from the database, replacing the missing measurements for the database based on a prediction from a model; and
   updating said model with said process state estimate.

17. A method for controlling a manufacturing process, includes:
   processing using a process input and producing a process output;
   storing the process input in a database;
   storing at least one measurement of the process output in the database associated with each process input;
   iterating over data from the database to estimate a process state, wherein a constrained quadratic optimization is solved at each iteration of data;
   if one or more measurements is missing from the database, replacing the missing measurements for the database based on a prediction from a model; and
   updating said model with said process state estimate, wherein if actual measurements become available a time period after process state estimation, for said one or more measurements which was missing, replacing the predicted measurements with said actual measurements, storing said actual measurements in said database, and utilizing said actual measurements in subsequent process state estimation.

18. The method of claims 16 wherein a controller receives the updated model and utilizes said updated model to produce the next process input.

19. The method of claim 17 wherein said time period can be variable.

20. The method of claim 16 wherein said storing of the process input includes providing a timestamp, and wherein said at least one measurement of the process output is associated with each process input using the timestamp.

21. A method for controlling a manufacturing process, includes:
   providing a database with process input data and associated process output data;
   iterating over data from the database to estimate a process state;
   if one or more measurements is missing from the database, replacing the missing measurements for the database based on a prediction from a model; and
   updating said model with said process state estimate.

22. A method for controlling a manufacturing process, includes:
   providing a database with process input data and associated process output data;
   iterating over data from the database to estimate a process state;
   if one or more measurements is missing from the database, replacing the missing measurements for the database based on a prediction from a model; and
   updating said model with said process state estimate, wherein if actual measurements become available a time period after process state estimation, for said one or more measurements which was missing, replacing the predicted measurements with said actual measurements, storing said actual measurements in said database, and utilizing said actual measurements in subsequent process state estimation.

23. The method of claim 21 wherein a controller receives the updated model and utilizes said updated model to produce the next process input.

24. The method of claim 22 wherein said time period can be variable.

25. The method of claim 21 wherein said process output data is associated with said process input data using a timestamp.

26. The method of claim 21 further including solving a constrained quadratic optimization at each iteration of said data.

27. A program storage media readable by a machine and containing instructions for performing the method contained in claim 1.

28. A program storage media readable by a machine and containing instructions for performing the method contained in claim 16.

29. A program storage media readable by a machine and containing instructions for performing the method contained in claim 21.

* * * * *